(12) United States Patent
Murata et al.

(10) Patent No.: US 8,535,444 B2
(45) Date of Patent: Sep. 17, 2013

(54) SUBSTRATE PROCESSING APPARATUS, METHOD OF MANUFACTURING SEMICONDUCTOR DEVICE, AND CEILING INSULATING PART

(75) Inventors: Hitoshi Murata, Toyama (JP); Tetsuya Kosugi, Toyama (JP); Shinobu Sugiura, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/367,751

(22) Filed: Feb. 9, 2009

(65) Prior Publication Data
US 2009/0209113 A1 Aug. 20, 2009

(30) Foreign Application Priority Data
Feb. 18, 2008 (JP) ................................. 2008-035889

(51) Int. Cl.
*C23C 16/00* (2006.01)
(52) U.S. Cl.
USPC ........................................................ 118/725
(58) Field of Classification Search
USPC .................... 118/715, 722, 724, 725
See application file for complete search history.

(56) References Cited

U.S. PATENT DOCUMENTS
6,686,601 B2 * 2/2004 Murrell et al. ........... 250/492.21

FOREIGN PATENT DOCUMENTS

| JP | 08-055811 | | 2/1996 |
|---|---|---|---|
| JP | 11302853 | | 11/1999 |
| JP | 2002139281 A | * | 5/2002 |
| JP | 2005-209937 | | 8/2005 |
| JP | 2007-067232 | | 3/2007 |
| JP | 2007067232 | | 3/2007 |
| JP | 2007073865 | | 3/2007 |
| JP | 2007-088325 | | 4/2007 |

OTHER PUBLICATIONS

English Machine Translation of JP 2002-139281. Obtained on Jul. 30, 2010 from http://www19.ipdl.inpit.go.jp/PA1/cgi-bin/PA1INDEX.*
Groove. (n.d.). Dictionary.com Unabridged. Retrieved Apr. 21, 2011, from Dictionary.com website: http://dictionary.reference.com/browse/groove.*

* cited by examiner

*Primary Examiner* — Maureen Gramaglia
(74) *Attorney, Agent, or Firm* — Brundidge & Stanger, P.C.

(57) ABSTRACT

Provided is a substrate processing apparatus. The substrate processing apparatus comprises a reaction vessel configured to process a substrate, and a heating device. The heating device comprises at least one sidewall insulating part surrounding the reaction vessel, a ceiling insulating part placed on the sidewall insulating part and comprising a plurality of stress relief grooves, and a heating element installed at an inner side of the sidewall insulating part.

4 Claims, 21 Drawing Sheets

IN-FURNACE SIDE

SUBSTRATE PROCESSING APPARATUS, METHOD OF MANUFACTURING SEMICONDUCTOR DEVICE, AND CEILING INSULATING PART

CROSS-REFERENCE TO RELATED PATENT APPLICATION

This U.S. non-provisional patent application claims priority under 35 U.S.C. §119 of Japanese Patent Application No. 2008-035889, filed on Feb. 18, 2008, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device, and a ceiling insulating part.

2. Description of the Prior Art

Examples of substrate processing apparatuses include semiconductor manufacturing apparatuses, and examples of the semiconductor manufacturing apparatuses include vertical diffusion-CVD (chemical vapor deposition) apparatuses. In such a substrate processing apparatus, a heating device is used to heat a substrate.

Patent document 1 discloses an exemplary heating device which is installed outside a reaction vessel and includes a circular sidewall insulating part, a ceiling insulating part placed on the sidewall insulating part, and a heating element installed inside the sidewall insulating part. In addition, Patent document 2 discloses technology of forming a radial slit from the center of a ceiling plate of a vertical wafer boat toward the circumference of the ceiling plate so as to prevent problems caused by thermal deformation.

[Patent document 1] Japanese Unexamined Patent application Publication No. H8-55811
[Patent document 2] Japanese Unexamined Patent application Publication No. 2007-67232

However, cracks are easily generated in the insulating parts of the heating device, especially, in the ceiling insulating part of the heating device, and the cracks develop to break a ceiling part of the heating device breaks and drop the ceiling insulating part. However, in the related art, proper countermeasures against such cracks of the ceiling insulating part have not been studied.

SUMMARY OF THE INVENTION

Objects of the present invention are to provide a substrate processing apparatus, a method of manufacturing a semiconductor device, and a ceiling insulating part, for reducing generation of cracks in the ceiling insulating part, and breakage and falling of the ceiling insulating part.

According to an aspect of the present invention, there is provided a substrate processing apparatus including: a reaction vessel configured to process a substrate; and a heating device, wherein the heating device includes: at least one sidewall insulating part surrounding the reaction vessel; a ceiling insulating part placed on the sidewall insulating part; and a heating element installed at an inner side of the sidewall insulating part, wherein the ceiling insulating part is divided into a plurality of parts by a dividing line and comprises a plurality of stress relief grooves extending from a center of the ceiling insulating part to a circumference thereof, each of the plurality of stress relief grooves having a depth with respect to a bottom surface of the ceiling insulating part without penetrating the ceiling insulating part and without dividing the ceiling insulating part into the plurality of parts.

According to another aspect of the present invention, there is provided a ceiling insulating part configured to be placed on a sidewall insulating part in a heating device of a substrate processing apparatus, the ceiling insulating part comprising a plurality of grooves configured to relief stresses.

According to another aspect of the present invention, there is provided a method of manufacturing a semiconductor device using the substrate processing apparatus, the method comprising processing a substrate disposed inside a reaction vessel by heating the substrate using the heating element while allowing stresses generated at a ceiling insulating part to be relieved at the grooves.

According to another aspect of the present invention, there is provided a method of manufacturing a semiconductor device, the method comprising processing a substrate disposed inside a reaction vessel by heating the substrate using a heating element while allowing a stress generated at a ceiling insulating part placed on a sidewall insulating part surrounding the reaction vessel to be relieved at a plurality of grooves disposed in the ceiling insulating part.

BRIEF DESCRIPTION OF THE DRAWINGS

FIG. 4A is an underside view illustrating a ceiling thermal insulator of a heater not including a rapid cooling device; and FIG. 4B is an underside view illustrating a ceiling thermal insulator of a heater including a rapid cooling device.

FIG. 10A illustrates an underside and an A-A section of a lower layer of a ceiling thermal insulator in which grooves serve as stress relief parts; and FIG. 10B illustrates an underside and a B-B section of a lower layer of a ceiling thermal insulator in which slits serves as stress relief parts

FIG. 8A is an underside view of a ceiling thermal insulator; FIG. 8B is a D-D sectional view taken along line D-D of FIG. 8A for illustrating an exemplary dividing line serving as a stress relief part; and FIG. 8C is a D-D sectional view taken along line D-D of FIG. 8A for illustrating another exemplary dividing line serving as a stress relief part.

FIG. 22A is an underside view (in-furnace side view) of a lower layer of a ceiling thermal insulator; FIG. 22B is a sectional view taken along line E-E of FIG. 22A; FIG. 22C is a top side view (top-plate-side view) of the lower layer of the ceiling thermal insulator; and FIG. 22D is a sectional view taken line F-F of FIG. 22A.

DETAILED DESCRIPTION OF THE PREFERRED EMBODIMENTS

Hereinafter, embodiments of the present invention will be explained with reference the attached drawings.

Figure 1:
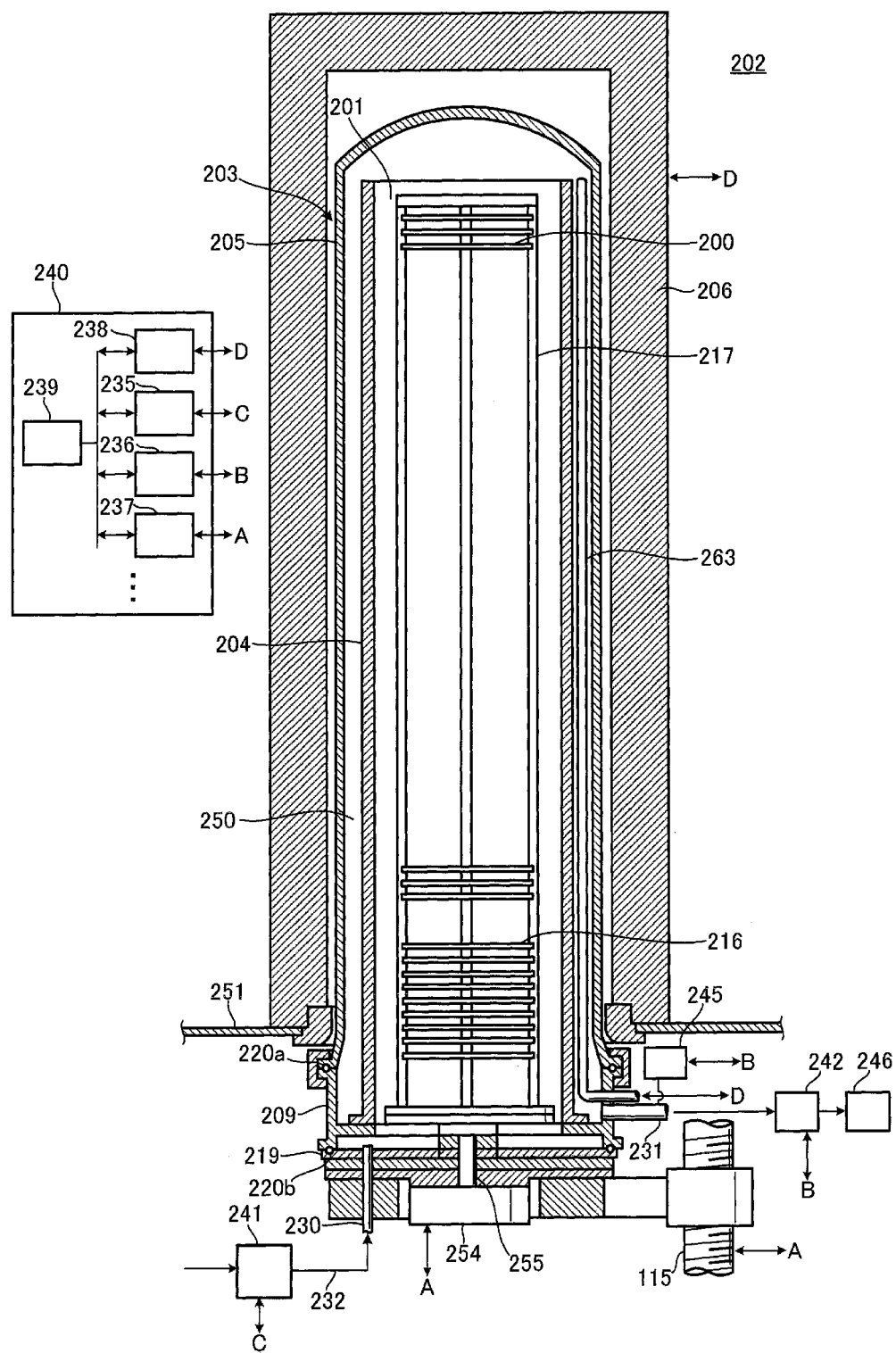
FIG. 1 is a sectional view illustrating a substrate processing apparatus relevant to an embodiment of the present invention.

FIG. 1 is a schematic vertical sectional view illustrating a process furnace 202 of a substrate processing apparatus in accordance with a preferred embodiment of the present invention.

As shown in FIG. 1, the process furnace 202 includes a heater 206 as a heating device. The heater 206 has a cylindrical shape and is vertically installed by a heater base 251 used as a holder plate for supporting the heater 206.

At the inside of the heater 206, a process tube 203 is coaxially disposed as a reaction vessel. The process tube 203 includes an inner tube 204 as an inner reaction vessel and an outer tube 205 installed outside the inner tube 204 as an outer reaction vessel. The inner tube 204 is made of a heat resistant material such as quartz ($SiO_2$) or silicon carbide (SiC) and has a cylindrical shape with opened top and bottom ends. A process chamber 201 is disposed at a hollow part of the inner tube 204. The process chamber 201 is configured to accommodate substrates such as wafers 200 which are horizontally positioned and vertically arranged in multiple stages by a boat 217 (described later). The outer tube 205 is made of a heat resistant material such as a quartz or silicon carbide. The outer tube 205 has a cylindrical shape having a closed top end and an opened bottom end, and the inner diameter of the outer tube 205 is larger than the outer diameter of the inner tube 204. The outer tube 205 is installed coaxially with the inner tube 204.

At the lower side of the outer tube 205, a manifold 209 is installed coaxially with the outer tube 205. The manifold 209 is made of a material such as stainless steel and has a cylindrical shape with opened top and bottom ends. The manifold 209 is engaged with the inner tube 204 and the outer tube 205 for supporting the inner tube 204 and the outer tube 205. Between the manifold 209 and the outer tube 205, an O-ring 220a is installed as a seal. The manifold 209 is supported by the heater base 251 so that the process tube 203 can be vertically installed. The process tube 203 and the manifold 209 constitute a reaction vessel.

A nozzle 230 is connected to a seal cap 219 (described later) in communication with the inside of the process chamber 201 as a gas introduction part, and a gas supply pipe 232 is connected to the nozzle 230. To the upstream side of the gas supply pipe 232 opposite to the nozzle 230, a process gas supply source (not shown) or an inert gas supply source (not shown) is connected, and a mass flow controller (MFC) 241 used as a gas flow control device is disposed between the upstream side of the gas supply pipe 232 and the gas supply source. A gas flow controller 235 is electrically connected to the MFC 241 so that the flow rate of gas supply can be adjusted to a desired level at a desired time.

At the manifold 209, an exhaust pipe 231 is installed to exhaust the inside atmosphere of the process chamber 201. The exhaust pipe 231 is disposed at a lower end side of a circular space 250 disposed between the inner tube 204 and the outer tube 205 and communicates with the circular space 250. A vacuum exhaust device 246 such as a vacuum pump is connected to the downstream side of the exhaust pipe 231 opposite to the manifold 209, and a pressure sensor 245 (used as a pressure detecting device) and a pressure adjusting device 242 are disposed between the vacuum exhaust device 246 and the downstream side of the exhaust pipe 231, so that the inside of the process chamber 201 can be evacuated to a predetermined pressure (vacuum degree). A pressure controller 236 is electrically connected to the pressure adjusting device 242 and the pressure sensor 245 to adjust the inside pressure of the process chamber 201 to a desired level at a desired time by controlling the pressure adjusting device 242 based on a pressure detected by the pressure sensor 245.

At the lower side of the manifold 209, the seal cap 219 is installed as a furnace throat cover for air-tightly closing the opened bottom end of the manifold 209. The seal cap 219 is configured to make contact with the bottom end of the manifold 209 in a vertical direction from the lower side of the manifold 209. The seal cap 219 is made of a metal such as stainless steel and has a disk shape. At the top surface of the seal cap 219, an O-ring 220b is installed as a seal to make contact with the bottom end of the manifold 209. At a side of the seal cap 219 opposite to the process chamber 201, a rotation mechanism 254 is installed. A shaft 255 of the rotation mechanism 254 is connected to the boat 217 (described later) through the seal cap 219 to rotate boat 217 in which the wafers 200 are held. The seal cap 219 is configured to be vertically moved by an elevating mechanism such as a boat elevator 115 vertically installed outside the process tube 203 so as to load the boat 217 into the process chamber 201 and unloaded the boat 217 from the process chamber 201. A driving controller 237 is electrically connected to the rotation mechanism 254 and the boat elevator 115 for controlling a desired operation at desired time.

The boat 217 is made of a heat resistant material such as quartz or silicon carbide and is configured to hold a plurality of wafers 200 in a manner such that the wafers 200 are horizontally positioned and arranged in multiple stages with the centers of the wafers 200 being aligned. At the lower side of the boat 217, a plurality of insulating plates 216, which are made of a heat resistant material such as quartz or silicon carbide and have a disk shape, are horizontally disposed in multiple stages as insulating members for preventing heat transfer from the heater 206 to the manifold 209.

Inside the process tube 203, a temperature sensor 263 is installed as a temperature detecting device. A temperature controller 238 is electrically connected to the heater 206 and the temperature sensor 263 to maintain the inside of the process chamber 201 at a desired temperature distribution at a desired time by controlling power to the heater 206 based on temperature information detected by the temperature sensor 263. A temperature switch (not shown) that operates at a temperature equal to or higher than a reference temperature is installed at the temperature sensor 263.

At the periphery of the process chamber 201, a cooling water main pipe (not shown) is installed. A flow switch (not shown) configured to operate when the amount of cooling water reduces to equal to or less than a predetermined level, a water-cooled radiator (not shown), and a water-cooled thyristor are installed at the cooling water main pipe. Temperature sensors (not shown) that operate at a temperature equal to or higher than a reference temperature are installed at the water-cooled radiator and the water-cooled thyristor.

The gas flow controller 235, the pressure controller 236, the driving controller 237, and the temperature controller 238 are designed to constitute an operating unit and an input/output unit and are electrically connected to a main controller 239 that controls the overall operation of the substrate processing apparatus. The gas flow controller 235, the pressure controller 236, the driving controller 237, the temperature controller 238 are configured as a controller 240.

Next, as an exemplary semiconductor device manufacturing process using the above-described processing furnace 202, a method of forming a thin film on a wafer 200 by chemical vapor deposition (CVD) will be explained. In the following explanation, operations of the respective parts of the substrate processing apparatus are controlled by the controller 240.

After a plurality of wafers 200 are charged into the boat 217, the boat 217 charged with the wafers 200 is lifted and loaded into the process chamber 201 by the boat elevator 115 as shown in FIG. 1. In this state, the bottom end of the manifold 209 is sealed by the seal cap 219 with the O-ring 220b being disposed therebetween.

The inside of the process chamber 201 is evacuated to a desired pressure (vacuum degree) by the vacuum exhaust device 246. At this time, the pressure inside the process chamber 201 is measured by the pressure sensor 245, and the pressure adjusting device 242 is feedback-controlled based on the measured pressure. In addition, the process chamber 201 is heated by the heater 206 to raise the temperature inside the process chamber 201. At this time, to obtain desired temperature distribution inside the process chamber 201, power to the heater 206 is feedback-controlled based on temperature information detected by the temperature sensor 263. Next, the wafers 200 are rotated by rotating the boat 217 using the rotation mechanism 254.

Thereafter, gas supplied from the process gas supply source while the flow rate of the gas is controlled by the MFC 241 is introduced into the process chamber 201 through the gas supply pipe 232 and the nozzle 230. The introduced gas flows upward inside the process chamber 201 and is discharged from the opened top end of the inner tube 204 to the circular space 250 where the gas is exhausted through the exhaust pipe 231. When the gas passes through the process chamber 201, the gas makes contact with the surfaces of the wafers 200 so that thin films can be deposited on the surfaces of the wafers 200 by thermal CVD reaction.

After a preset time, inert gas is supplied from the inert gas supply source to replace the inside atmosphere of the process chamber 201 with the inert gas, and at this time, the pressure inside the process chamber 201 returns to atmospheric pressure.

After that, the seal cap 219 is moved down by the boat elevator 115 to open the bottom end of the manifold 209 and unload the boat 217, in which the processed wafers 200 are held, from the process tube 203 to the outside through the opened bottom end of the manifold 209. Then, the processed wafers 200 are discharged from the boat 217.

In the current embodiment, wafer processing conditions in the processing furnace 202 can be as follows. For example, SiN films (silicon nitride films) may be disposed at a temperature of 400° C. to 800° C., a process pressure of 1 Torr to 50 Torr, a $SiH_2Cl_2$ gas (film forming gas) flow rate of 0.02 slm to 0.30 slm, a $NH_3$ gas (film forming gas) flow rate of 0.1 slm to 2.0 slm. For example, poly-Si films (polysilicon films) may be disposed at a temperature of 350° C. to 700° C., a process pressure of 1 Torr to 50 Torr, a $SiH_2$ gas (film forming gas) flow rate of 0.01 slm to 1.20 slm. While maintaining the processing conditions constant within the above-mentioned exemplary ranges, the wafers 200 are processed.

Hereinafter, the heater 206 will be explained in detail.

Figure 2A:
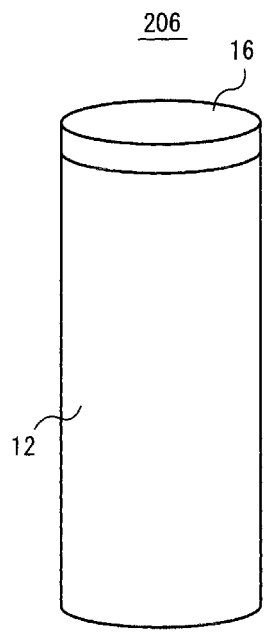
FIG. 2A and FIG. 2B are a perspective view and a sectional view illustrating a heater not including a rapid cooling device in accordance with an embodiment of the present invention.
Figure 2B:
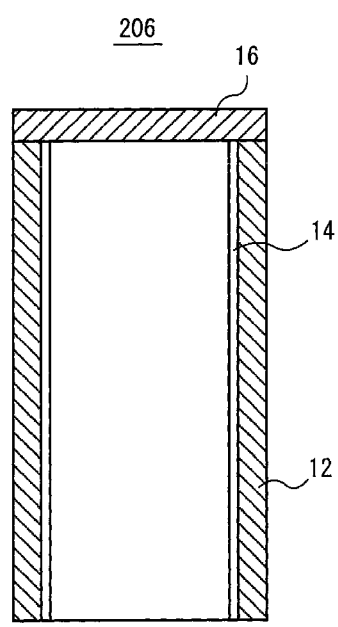

The heater 206 may include or not include a rapid cooling device. FIG. 2A and FIG. 2B illustrate a heater 206 not including a rapid cooling device, and FIG. 3A and FIG. 3B illustrate a heater 206 including a rapid cooling device.

Referring to FIG. 2A and FIG. 2B, the heater 206, which is not provided with a rapid cooling device, includes a sidewall thermal insulator 12 (also referred to as a sidewall insulating part) which has a ring shape (preferably, a cylindrical shape). At the inside of the sidewall thermal insulator 12 (preferably, along the inner circumference of the sidewall thermal insulator 12), a heating element 14 is disposed. At the top side of the sidewall thermal insulator 12, a ceiling thermal insulator 16 (also referred to as a ceiling insulating part) shaped like, for example, a disk, is placed. At the space surrounded by the sidewall thermal insulator 12 and the ceiling thermal insulator 16, the above-described process tube 203 is installed as a reaction vessel.

Figure 3A:
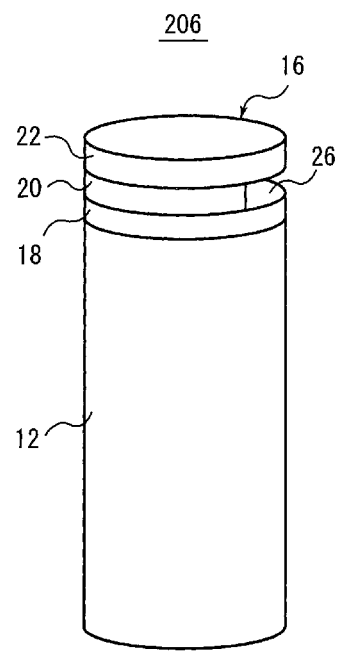
FIG. 3A and FIG. 3B are a perspective view and a sectional view illustrating a heater including a rapid cooling device in accordance with an embodiment of the present invention.
Figure 3B:
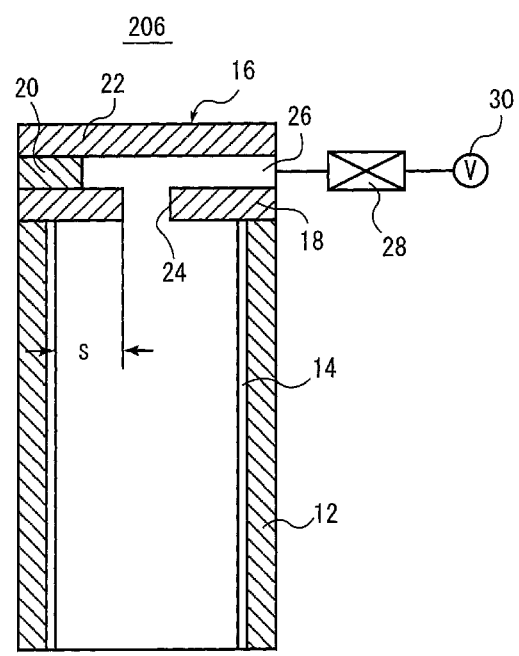

Referring to FIG. 3A and FIG. 3B, the heater 206, which is provided with a rapid cooling device, includes a ceiling thermal insulator 16 having a structure different from that of the ceiling thermal insulator 16 of the heater 206 shown in FIG.

2A and FIG. 2B which is not provided with a rapid cooling device. The ceiling thermal insulator 16 includes a lower layer 18 placed on a sidewall thermal insulator 12, a middle layer 20 placed on the lower layer 18, and an upper layer 22 placed on the middle layer 20. At the center of the lower layer 18, an exhaust hole 24 is disposed. At the middle layer 20, an exhaust channel 26 is disposed. The exhaust channel 26 is disposed from a lateral side of the middle layer 20 and passes through the center of the middle layer 20. One end of the exhaust channel 26 is connected to the exhaust hole 24, and the other end of the exhaust channel 26 is opened at a side of the heater 206. A cooling fan 30 is connected to the opened end of the exhaust channel 26 with a radiator 28 being disposed therebetween so that gas can be exhausted by operating the cooling fan 30 from the inside of the heater 206 through the exhaust hole 24, the exhaust channel 26, and the radiator 28 to cool the heater 206 rapidly.

The sidewall thermal insulator 12 and the ceiling thermal insulator 16 are made of a material such as an aluminum oxide or a silicon oxide.

In the heater 206 of FIG. 2A and FIG. 2B which does not include a rapid cooling device, the ceiling thermal insulator 16 may be formed in a multi-layer structure. In addition, at least one of the lower layer 18, the middle layer 20, and the upper layer 22 shown in FIG. 3A and FIG. 3B may be formed in a multi-layer structure.

In the related, heaters such as the above-described heaters 206 have problems in that cracks initiate and develop easily in the ceiling thermal insulator 16 to break the ceiling part of the heater 206 and separate a part of the ceiling thermal insulator 16. Furthermore, since heat dissipates through the cracks, temperature controlling of the inside of the process chamber 201 may be affected, or energy may be wasted due to the dissipation of heat.

Figure 4A:
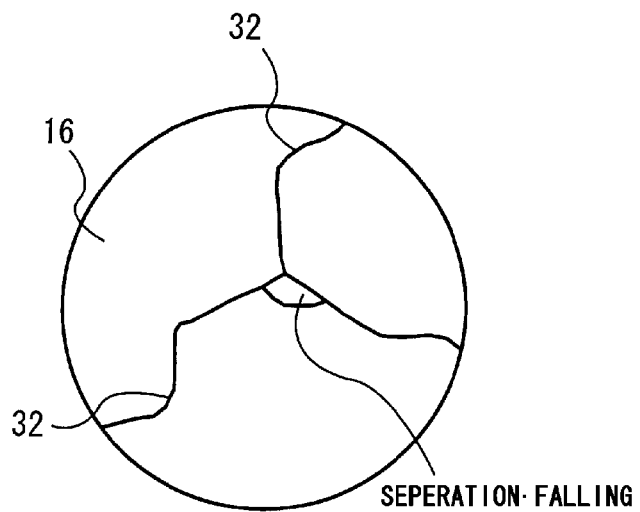
FIG. 4A and FIG. 4B illustrate cracked ceiling thermal insulators of heaters of the related art.
Figure 4B:
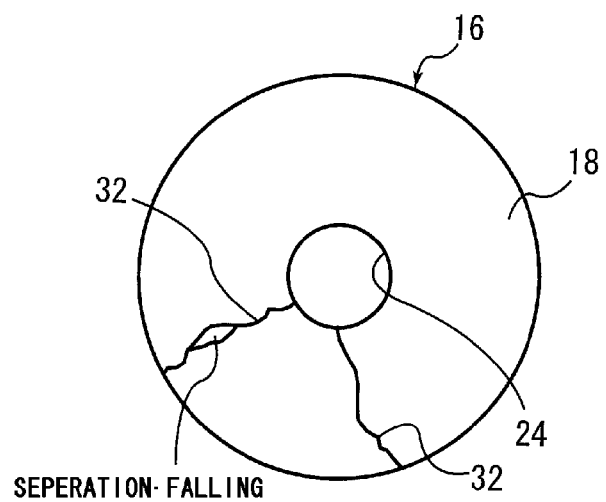

That is, in the ceiling thermal insulator 16 of the heater 206 that does not include a rapid cooling device, a plurality of cracks 32 can be initiated from the center part as shown in FIG. 4A. A part of the ceiling thermal insulator 16 enclosed by the cracks 32 may be separated down to the heater 206. In addition, heat may be discharged from an unexpected part through the cracks 32. On the other hand, in the ceiling thermal insulator 16 (particularly, in the lower layer 18) of the heater 206 that includes a rapid cooling device, as shown in FIG. 4B, a plurality of cracks 32 may be generated between the exhaust hole 24 and the peripheral part of the lower layer 18, and thus a part of the lower layer 18 surrounded by the cracks 32 may be separated down to the heater 206 like in the case of the heater 206 that does not include a rapid cooling device. Further, heat may be discharged from an unexpected part through the cracks 32.

Next, the generation mechanism of cracks 32 will be explained with reference to the lower layer 18 of the ceiling thermal insulator 16 of the heater 206 that includes a rapid cooling device.

When the heater 206 of the substrate processing apparatus is used to process a substrate disposed in the process chamber 201, the temperature of the heater 206 is repeatedly increased and decreased. For example, the temperature of the heater 206 decreases to 400° C. for loading and unloading processes and increases to 1100° C. for a substrate processing process.

Figure 5:
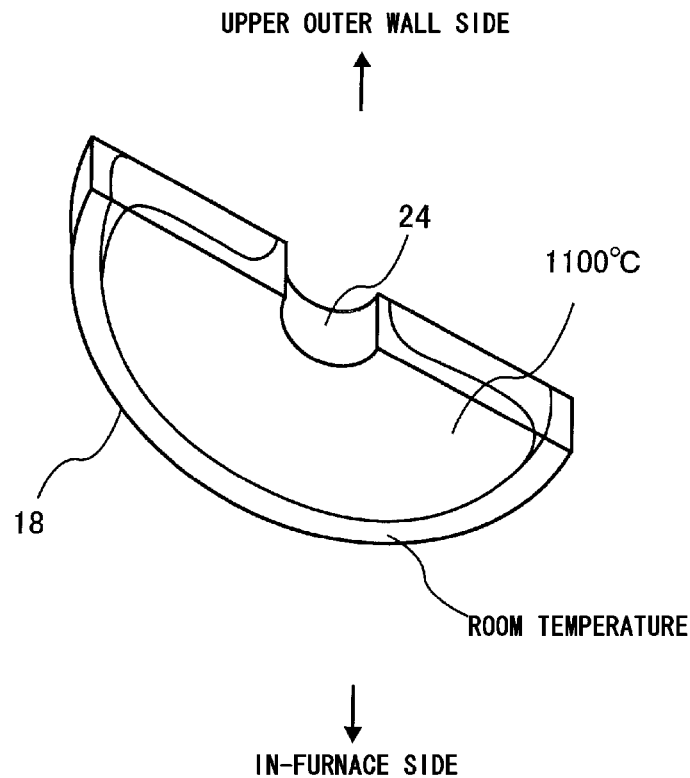
FIG. 5 is a perspective view illustrating a central section of a lower layer of a ceiling thermal insulator to show temperature distribution of the lower layer during heating in accordance with an embodiment of the present invention.
Figure 6:
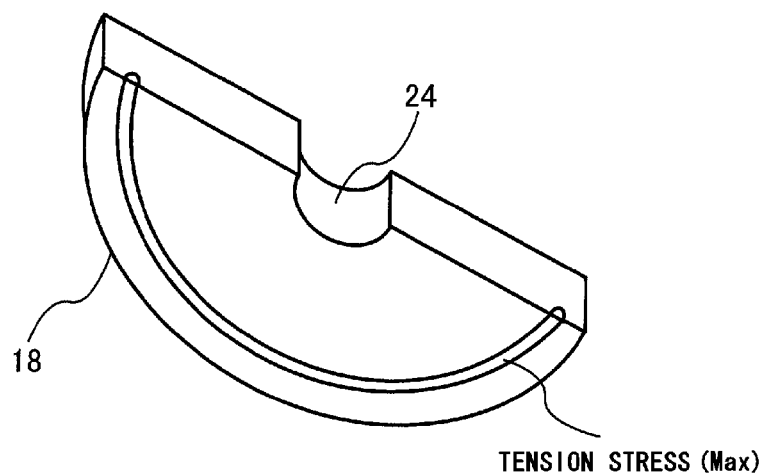
FIG. 6 is a perspective view illustrating a central section of the lower layer of the ceiling thermal insulator to show stress distribution of the lower layer during heating in accordance with an embodiment of the present invention.

FIG. 5 illustrates temperature distribution of the lower layer 18 during heating. FIG. 6 illustrates stress distribution of the lower layer 18 during heating.

As shown in FIG. 5, the temperature of the center part of the lower layer 18 including the exhaust hole 24 is increased to about 1100° C. by heat transferred from the in-furnace side; however, the temperature of the peripheral part of the lower layer 18 is close to room temperature. The reason for this is that the peripheral part is in contact with the sidewall thermal insulator 12. Therefore, the center part is thermally expanded due to a high temperature, and the peripheral part is little expanded. As shown in FIG. 6, due to the difference in expansion rate, a tension stress is concentrated on the vicinity of the peripheral part. In addition, since the peripheral part supports the weight of the ceiling thermal insulator 16, a moment (stress) created by the weight of the center part is concentrated on the peripheral part. If these stresses exceed the tension strength of the lower layer 18, cracks are formed in the peripheral part (particularly, in the bottom of the peripheral part). When the upper outer wall side and the in-furnace side are compared, the temperature of the lower side of the lower layer 18 facing the in-furnace side is high at about 1100° C. due to heat transferred from the in-furnace side; however, the temperature of the upper side of the lower layer 18 facing the upper outer wall side is relatively low at about 400° C. to about 600° C. Therefore, there exists a stress between the upper and lower sides of the lower layer 18; however the stress is small because the temperature gradient between the upper and lower sides is not steep as compared with the temperature gradient between the peripheral part and the center part. That is, the possibility of cracks in the region between the in-furnace side and upper outer wall side of the ceiling thermal insulator 16 is low as compared with the possibility of cracks in the peripheral part; however, it is preferable that the ceiling thermal insulator 16 have a plurality of layers that are not bonded together and allowed to contract and expand freely so as to prevent generation of cracks between the in-furnace side and the upper outer wall side.

Figure 7:
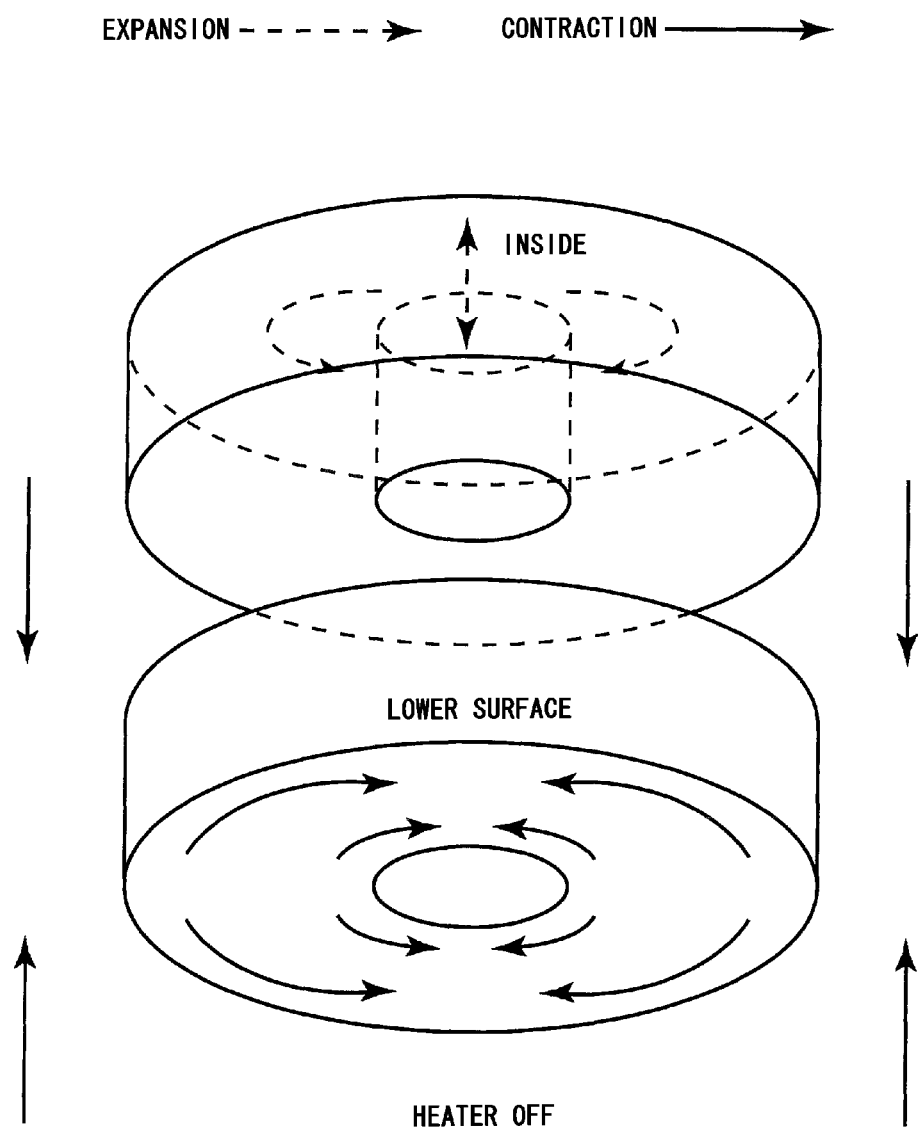
FIG. 7 is a perspective view illustrating a central section of the lower layer of the ceiling thermal insulator to show stress distribution of the lower layer during cooling in accordance with an embodiment of the present invention.

FIG. 7 illustrates stress distribution of the lower layer 18 during cooling. First, when heated atmosphere is exhausted through the exhaust hole 24, the temperature of the center part of the lower layer 18 is temporarily increased. Next, when power to the heating element 14 is turned off to decrease the temperature, shrink starts from the bottom of the lower layer 18. When the temperature starts to decrease, since the inner region of the lower layer 18 is still expanded due to accumulated heat, the lower layer 18 deforms due to the expanding inner region and shrinking outer region of the lower layer 18. Then, a tension stress is generated at the bottom of the lower layer 18 which is initially cooled, thereby causing vertical cracking. In the case where a crack is already generated in the periphery of the lower layer 18, the tension stress causes the crack to develop inward to the exhaust hole 24.

Such cracks can be prevented by dividing the ceiling insulating part 16 into parts; however, stresses caused by thermal expansion and contraction of the divided thermal insulator parts are not absorbed if the divided parts are in tight contact with each other, and thus the thermal insulator parts may be broken or split. As a countermeasure against falling of the ceiling thermal insulator 16, a safety net (receiving net) made of insulating cloth can be installed to block and receive the falling ceiling thermal insulator 16. However, the safety net is expensive, and although the safety net blocks and receives the falling ceiling thermal insulator 16, pieces broken from the ceiling thermal insulator 16 fall through holes of the safety net and become particles, and the insulating characteristics of the ceiling part are varied due to the fallen ceiling thermal insulator 16.

Furthermore, in the case where an exhaust hole is disposed at a ceiling plate for rapid cooling, there is problem in that the thermal insulator fallen on the safety net is also discharged through the exhaust hole.

Therefore, to prevent generation of such cracks, a plurality of stress relief parts are installed at the ceiling thermal insulator 16 (the lower layer 18). As explained above, it is considered that cracks are generated in the ceiling thermal insulator 16 due to stresses caused by thermal expansion and contraction resulted from temperature variations of the heater 206. Thus, generation of cracks can be suppressed by reducing such stresses.

Figure 8A:
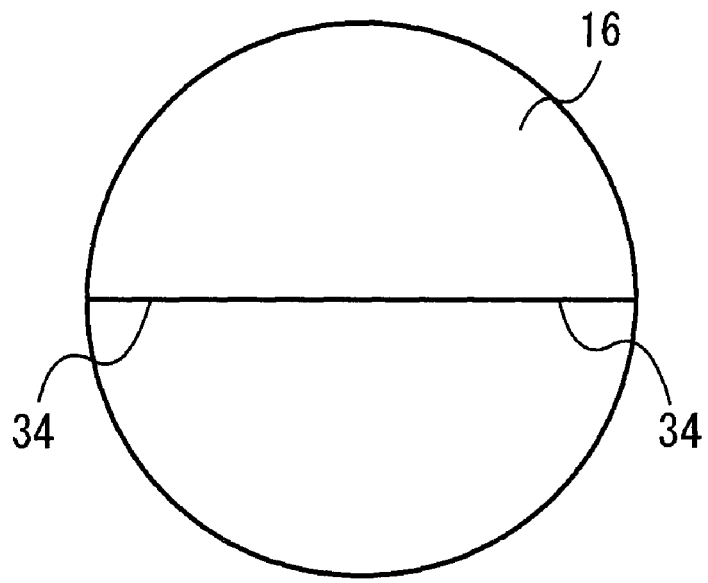
FIG. 8A through FIG. 8D are underside views illustrating examples of a ceiling thermal insulator of a heater not including a rapid cooling device in accordance with an embodiment of the present invention.
Figure 8B:
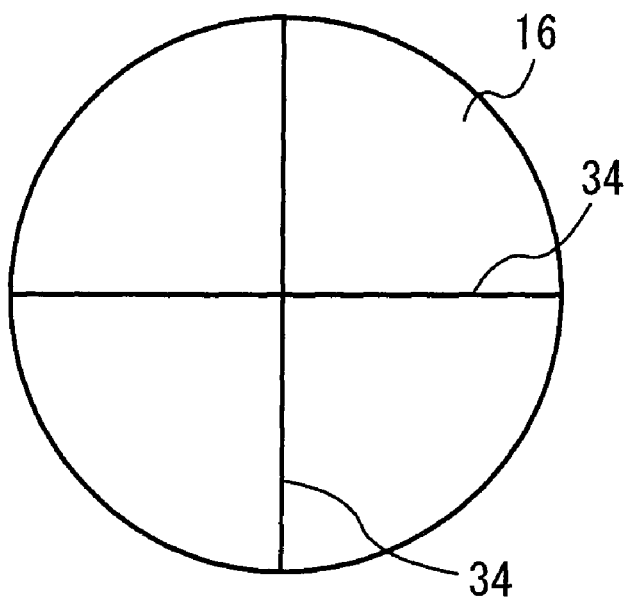
Figure 8C:
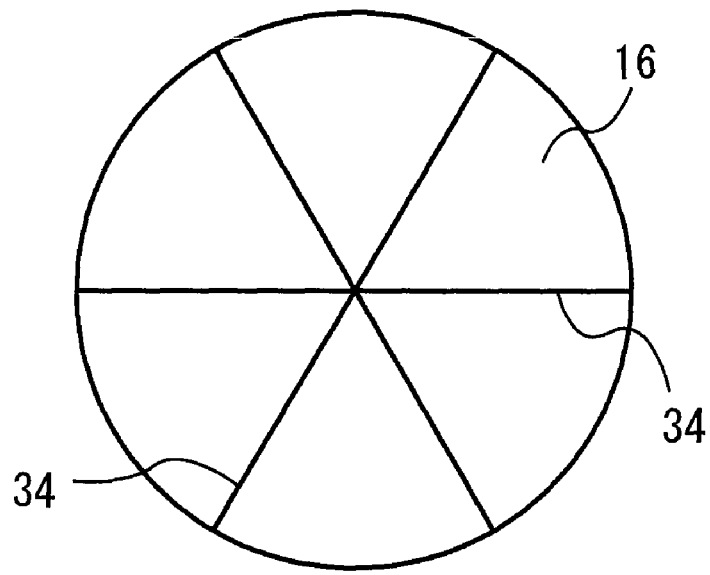
Figure 8D:
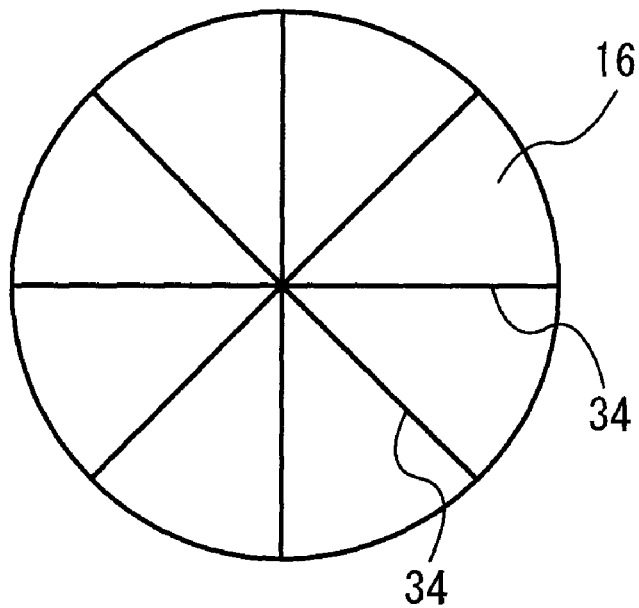

FIG. 8A through FIG. 8D illustrate examples of stress relief parts 34 provided at a ceiling thermal insulator 16 used without a rapid cooling device. The plurality of stress relief parts 34 are configured by grooves (of which the definition will be described later) extending from the center part of the ceiling thermal insulator 16 (in the current embodiment, the center axis of the ceiling thermal insulator 16) toward the peripheral part of the ceiling thermal insulator 16. FIG. 8A illustrates two stress relief parts 34 arranged at 180 degrees with each other. FIG. 8B illustrates four stress relief parts 34 arranged at 90 degrees with each other. FIG. 8C illustrates six stress relief parts 34 arranged at 60 degrees with each other. FIG. 8D illustrates eight stress relief parts 34 arranged at 45 degrees with each other.

Figure 9A:
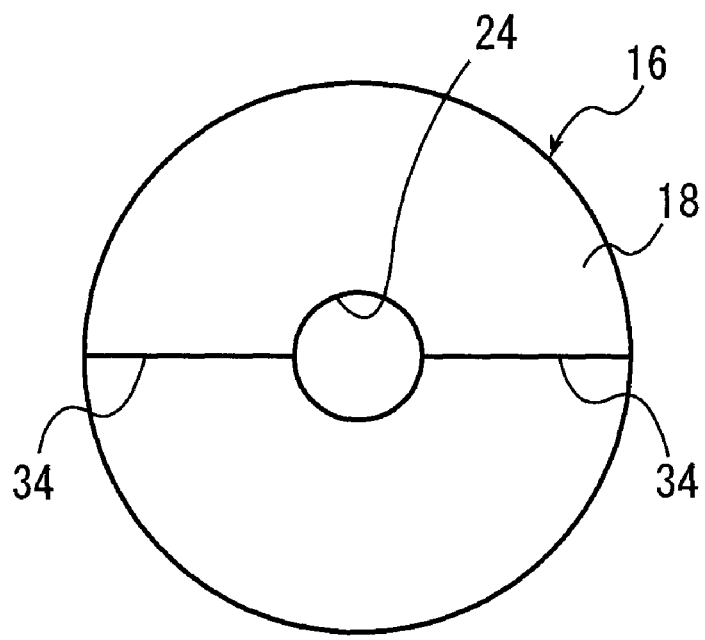
FIG. 9A through FIG. 9D are underside views illustrating examples of a lower layer of a ceiling thermal insulator of a heater including a rapid cooling device in accordance with an embodiment of the present invention.
Figure 9B:
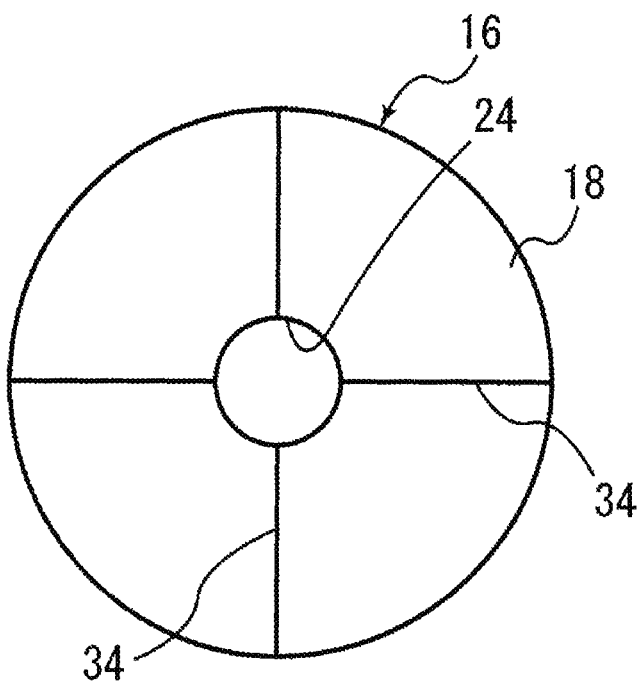
Figure 9C:
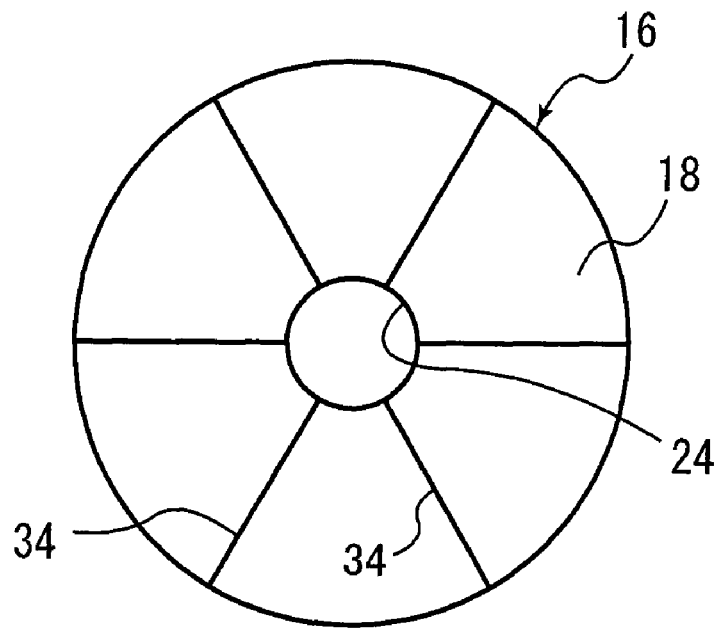
Figure 9D:
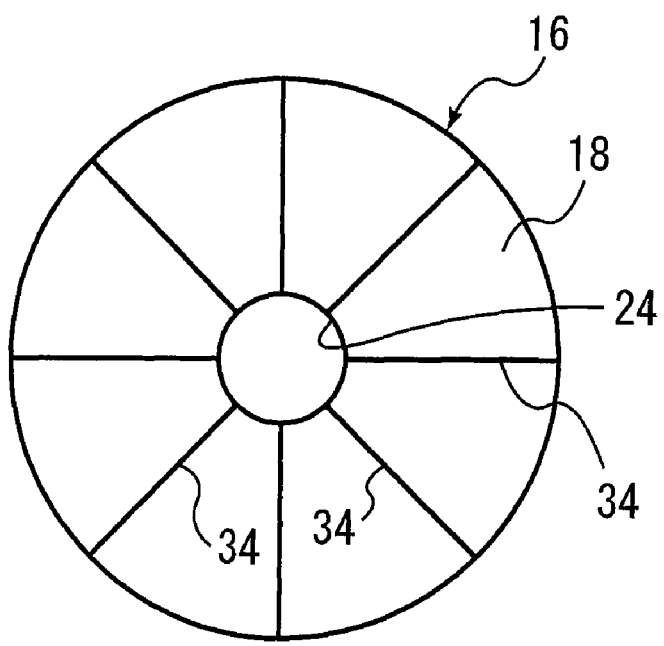

FIG. 9A through FIG. 9D illustrate examples of stress relief parts 34 provided at a lower layer 18 of a ceiling thermal insulator 16 used with a rapid cooling device. The plurality of stress relief parts 34 are disposed from the center part of the lower layer 18 (in the current embodiment, from an exhaust hole 24 of the lower layer 18) toward the peripheral part of the lower layer 18. FIG. 9A illustrates two stress relief parts 34 arranged at 180 degrees with each other. FIG. 9B illustrates four stress relief parts 34 arranged at 90 degrees with each other. FIG. 9C illustrates six stress relief parts 34 arranged at 60 degrees with each other. FIG. 8D illustrates eight stress relief parts 34 arranged at 45 degrees with each other.

As illustrated above, the stress relief parts 34 are arranged at an angle equal to or smaller than 180 degrees due to the following reason. Since the ceiling thermal insulator 16 expands from its center side to its peripheral side, it is preferable that at least one stress relief part 34 be disposed at a sector of the ceiling thermal insulator 16 having an angle equal to or smaller than 180 degrees, and otherwise, it is difficult to relieve a stress at a part of the ceiling thermal insulator 16 where the stress relief part 34 is not disposed. That is, if at least one stress relief part 34 is disposed at each sector of the ceiling thermal insulator 16 having an angle equal to or smaller than 180 degrees, expansion of each section of the ceiling thermal insulator 16 can be absorbed. In addition, by arranging the stress relief parts 34 at regular angles, stresses can be uniformly relieved.

Figure 10A:
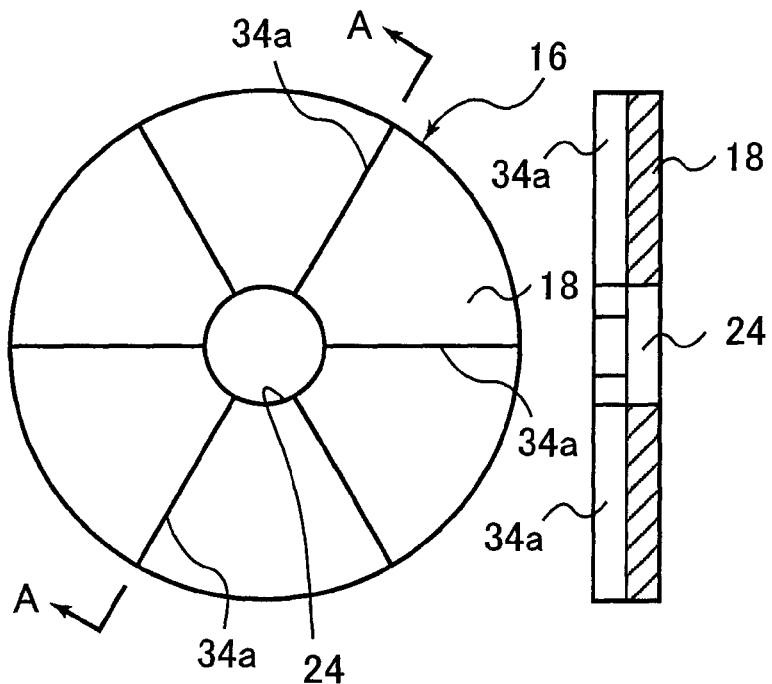
FIG. 10A and FIG. 10B illustrate examples of stress relief parts in accordance with an embodiment of the present invention.

FIG. 10A illustrates examples of grooves 34a as stress relief parts 34 of a ceiling thermal insulator 16 used with a rapid cooling device. Referring to FIG. 10A, the grooves 34a are disposed by cutting in a manner such that the grooves 34a do not divide the ceiling thermal insulator 16 in the circumferential direction of the ceiling thermal insulator 16 and do not penetrate the top surface of the ceiling thermal insulator 16.

Hereinafter, an explanation will be given on the case where the stress relief parts 34 are disposed at the lower layer 18 of the heater 206 of FIG. 3A and FIG. 3B provided with a rapid cooling device.

Figure 10B:
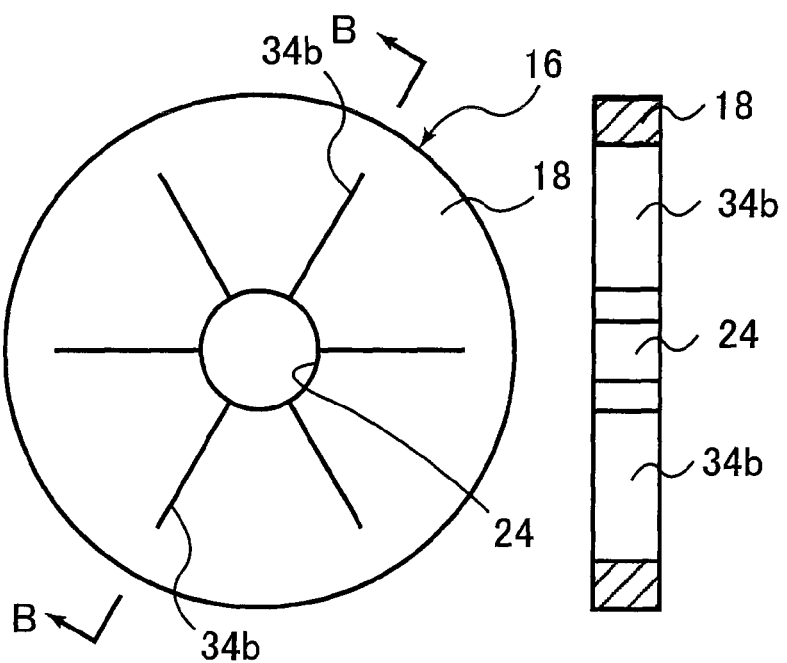

As shown in FIG. 3A and FIG. 3B, in the case where the ceiling thermal insulator 16 is configured by vertically divided layers such as the lower layer 18, the middle layer 20, and the upper layer 22, falling of parts of the ceiling thermal insulator 16 or cracking of the ceiling thermal insulator 16 can be prevented. Preferably, slits 34b are disposed at the lower layer 18 of the ceiling thermal insulator 16. Referring to FIG. 10B, the slits 34b are formed by cutting in a manner such that the slits 34b penetrate the ceiling insulating part 16 from the top side to the bottom side of the lower layer 18 but do not divide the ceiling insulating part 16. Therefore, the lower layer 18 can be formed in one piece, and the heater 206 can be easily manufactured. More preferably, the above-described grooves 34a are disposed in the bottom surface of the lower layer 18. In this case, heat dissipation through the upper outer wall side of the ceiling thermal insulator 16 can be prevented. More preferably, the grooves 34a or the slits 34b are disposed in the lower layer 18 from the center part of the lower layer 18 to an intermediate part, preferably, to the inner surface of the sidewall thermal insulator 12 as indicated by "S" in FIG. 3B. If the slits 34b or the grooves 34a are disposed to the lateral end part of the lower layer 18, heat dissipates from the inside of the heater 206 through the slits 34b or the grooves 34a; however, if the slits 34b or the grooves 34a are disposed to extend from the center part of the ceiling thermal insulator 16 and not to extend to the lateral end part of the ceiling thermal insulator 16, heat dissipation can be prevented. Therefore, energy can be saved, and deteriorations of temperature controlling and film-thickness uniformity caused by non-uniform, circumferential heat dissipation from the peripheral parts of substrates can be prevented. The above-described slits 34b can be grooves disposed in the ceiling thermal insulator 16 including the lower layer 18, the middle layer 20, and the upper layer 22. In this case, since the grooves 34a are configured by slits communicating with each other between layers, heat can be dissipated between the layers; however, except for the inter-layer heat dissipation, the same effect can be attained.

Figure 11A:
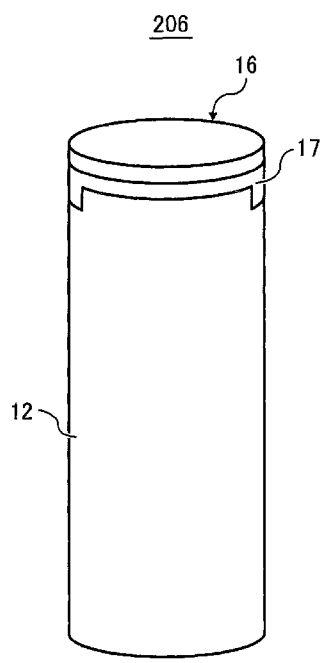
FIG. 11A and FIG. 11B are a perspective view and a section view illustrating a modification example of a placement structure of a ceiling thermal insulator of a heater not including a rapid cooling device in accordance with an embodiment of the present invention.
Figure 11B:
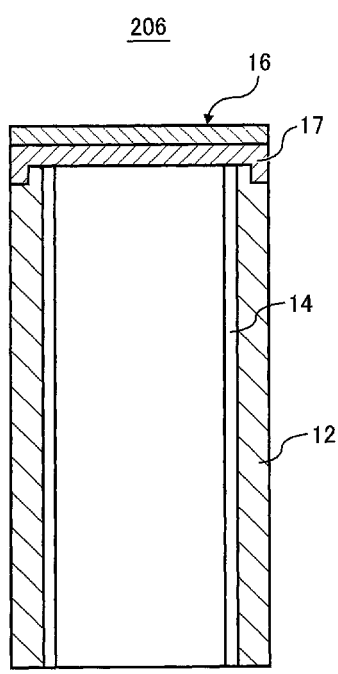

FIG. 11A and FIG. 11B illustrate a modification example of a placement structure between the ceiling thermal insulator 16 and the sidewall insulating part 12 of the heater 206 not including a rapid cooling device.

The ceiling thermal insulator 16 is formed in a multi-layer structure, and a layer of the ceiling thermal insulator 16 facing an in-furnace side is referred as an in-furnace layer 17. At the peripheral part of the in-furnace layer 17 of the ceiling thermal insulator 16, a circular convexed part is disposed, and at a side of the sidewall thermal insulator 12 facing the convexed part, a circular concave part is disposed. Therefore, the ceiling thermal insulator 16 can be easily fit to the sidewall thermal insulator 12. In addition, heat dissipation through the placement part can be prevented. In the above-described structure, stress relief parts 34 may be disposed from the center part of the in-furnace layer 17 to an intermediate part, preferably, to the convexed part of the in-furnace layer 17 of the ceiling thermal insulator 16.

Figure 12A:
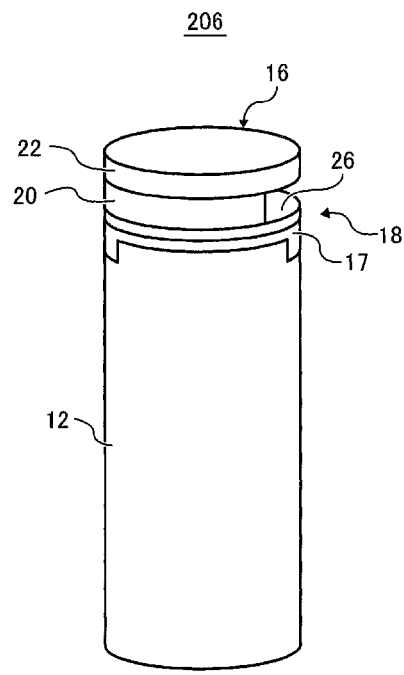
FIG. 12A and FIG. 12B are a perspective view and a section view illustrating a modification example of a placement structure of a ceiling thermal insulator of a heater including a rapid cooling device in accordance with an embodiment of the present invention.
Figure 12B:
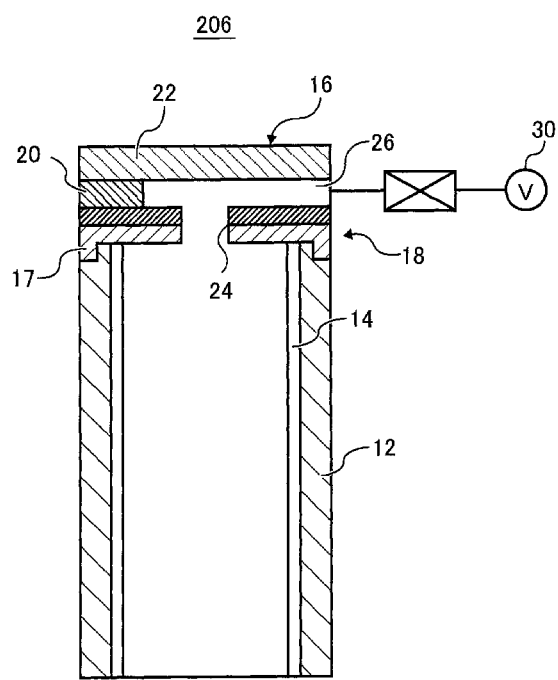

FIG. 12A and FIG. 12B illustrate a modification example of the placement structure between the lower layer 18 of the ceiling thermal insulator 16 and the sidewall insulating part 12 of the heater 206 including a rapid cooling device. Like the above, the lower layer 18 of the ceiling thermal insulator 16 is formed in a multi-layer structure, and a layer of the lower layer 18 facing the in-furnace side is referred as an in-furnace layer 17. As described above, at the peripheral part of the in-furnace layer 17 of the lower layer 18, a circular convexed part is disposed, and at a side of the sidewall thermal insulator 12 facing the convexed part, a circular concave part is disposed, so that the lower layer 18 can be easily fit to the sidewall thermal insulator 12, and heat dissipation through the placement structure can be prevented. In addition, as explained above, stress relief parts 34 may be disposed from the center part of the in-furnace layer 17 to an intermediate part, preferably, to the convexed part of the in-furnace layer 17 of the lower layer 18.

Hereinafter, various modification examples of the stress relief parts 34 will be explained.

Figure 13:
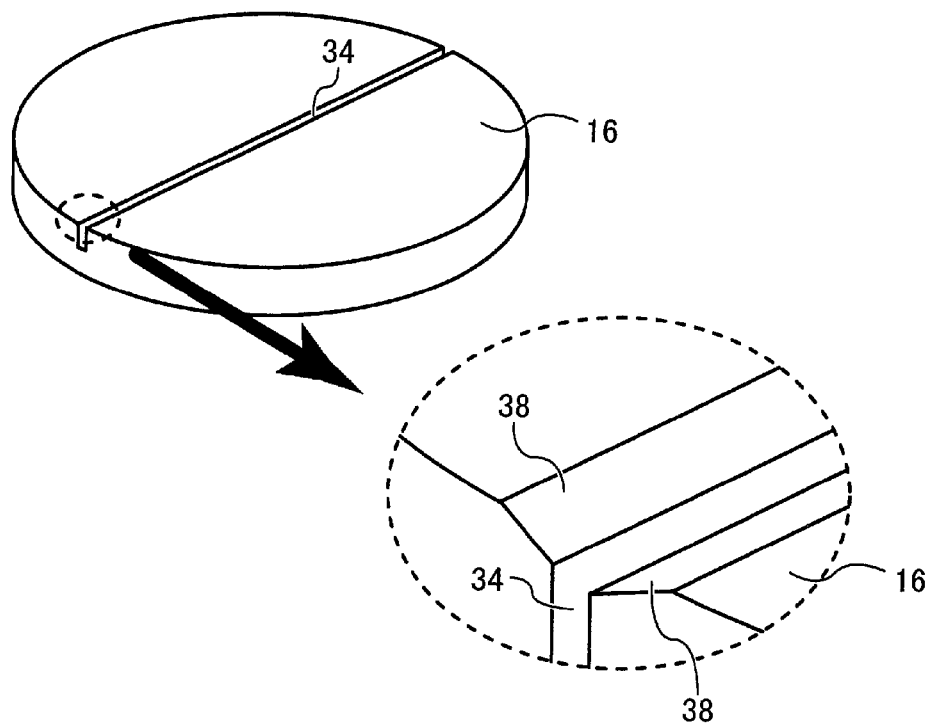
FIG. 13 is a perspective view of a ceiling thermal insulator for illustrating a first modification example in accordance with an embodiment of the present invention.
Figure 14:
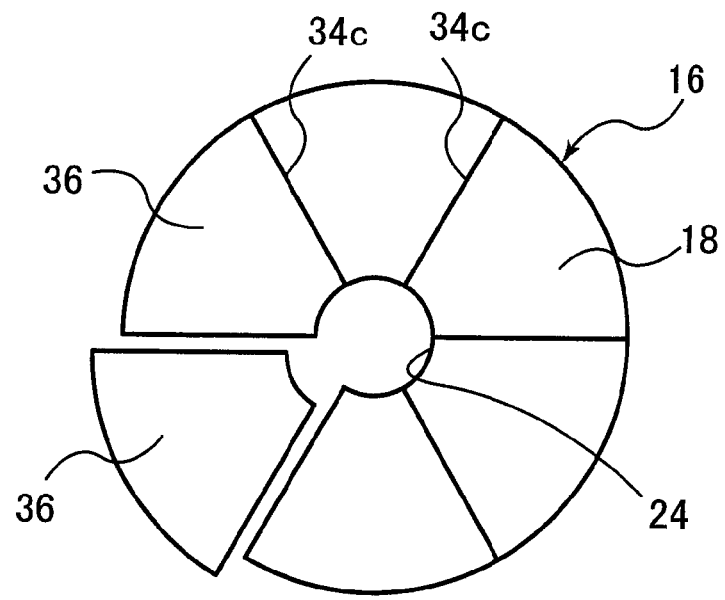
FIG. 14 is an underside view illustrating a lower layer of a ceiling thermal insulator in which dividing lines serves as stress relief parts in accordance with an embodiment of the present invention.

FIG. 13 illustrates a first modification example. In the first modification example, angled edges of a stress relief part 34 disposed in the bottom of a ceiling thermal insulator 16 are chamfered to form a tapered part 38 along the length of the stress relief part 34. If the angled edges of the bottom of the stress relief part 34 have an angle of 90 degrees, the angled edges can be easily broken by impacts during an assembling operation or thermal shocks during a heater temperature raising period. However, owing to the tapered part 38, the stress relief part 34 can have a large opened angle, and thus, such problems can be prevented. The same effect can be attained by forming the tapered part 38 in a rounded shape instead of a chambered shape. Furthermore, the tapered part 38 may also be disposed at the stress relief part 34 when the stress relief part 34 is shaped in the form of a slit 34b or a dividing line 34c as well as when the stress relief part 34 is shaped in the form of a groove 34a. The dividing line 34c is a line used to divide the ceiling thermal insulator 16 into a plurality of parts 36 as shown in FIG. 14 (in the example of FIG. 14, six parts 36 are shown).

Figure 15:
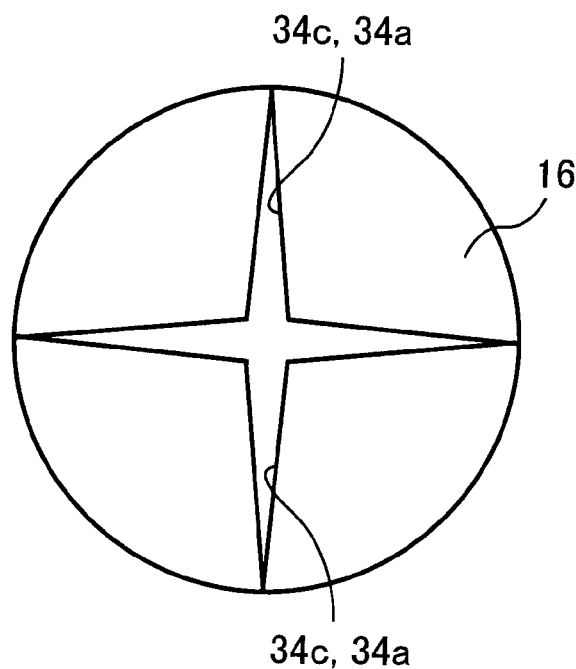
FIG. 15 is an underside view of a ceiling thermal insulator for illustrating a second modification example in accordance with an embodiment of the present invention.

FIG. 15 illustrates a second modification example. In the second modification example which is applicable to the ceiling thermal insulator 16 of the heater 206 not including a rapid cooling device, four dividing lines 34c are provided as stress relief parts 34, and the stress relief parts 34 have a width increasing from the peripheral part to the center part of the ceiling thermal insulator 16. In the current modification example, it is more preferable that the width of the stress relief parts 34 increases gradually from the peripheral part to the center part (center axis) of the ceiling thermal insulator 16. Since the in-furnace temperature is highest at a center part, the width is highest at the center part to efficiently absorb thermal expansion. Preferably, the stress relief parts 34 can have the form of grooves 34a, and in this case, heat dissipation to the upper outer wall side can be suppressed. The second modification example can also be applied to the ceiling thermal insulator 16 of the heater including a rapid cooling device. In this case, an exhaust hole 24 is disposed at the center axis of the ceiling thermal insulator 16.

Figure 16:
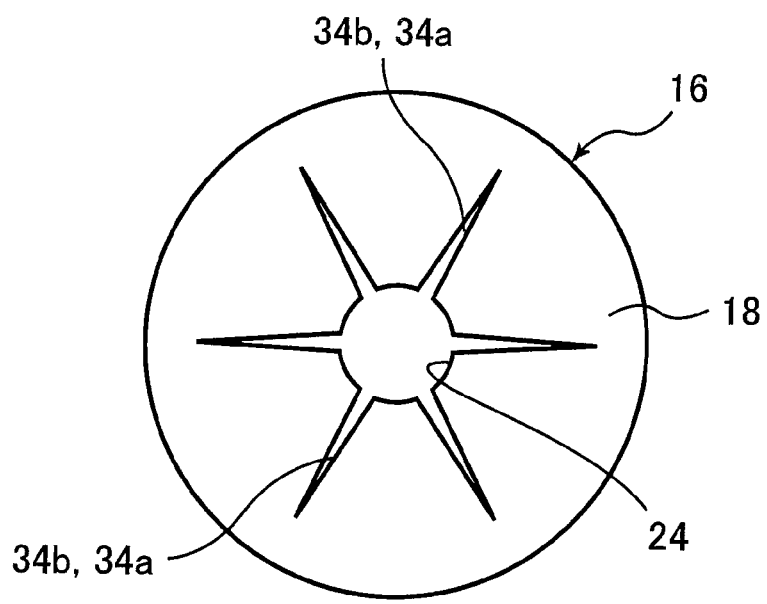
FIG. 16 is an underside view of a lower layer of a ceiling thermal insulator for illustrating a third modification example in accordance with an embodiment of the present invention.

FIG. 16 illustrates a third modification example. In the third modification example which is applicable to the lower layer 18 of the ceiling thermal insulator 16 of the heater 206 including a rapid cooling device, six slits 34b are provided as stress relief parts 34, and the stress relief parts 34 extend from an intermediate part between the center and peripheral part of the lower layer 18 toward an exhaust hole 24 of the lower layer 18 with a width greater at the exhaust hole 24 (center axis) than at the intermediate part of the lower layer 18. In the current modification example, it is more preferable that the width of the stress relief parts 34 increases gradually from the intermediate part to the exhaust hole 24. Since the temperature of the exhaust hole 24 is highest, the width is highest at the exhaust hole 24 to efficiently absorb thermal expansion. Furthermore, since the peripheral part is not divided and has a one-piece structure, the number of components can be reduced. Like the second modification example, the stress relief parts 34 can be have the form of grooves 34a, and in this case, heat dissipation to the upper outer wall side can be suppressed. The third modification example can also be applied to the ceiling thermal insulator 16 of the heater that does not include a rapid cooling device. In this case, the wide of the stress relief parts 34 increases gradually from the intermediate part to the center part (center axis) of the lower layer 18.

Figure 17A:
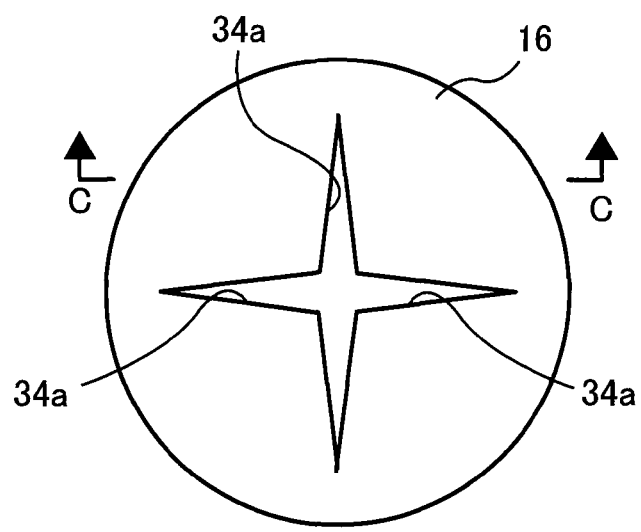
FIG. 17A and FIG. 17B are an underside view and a C-C sectional view of a ceiling thermal insulator for illustrating a fourth modification example in accordance with an embodiment of the present invention.
Figure 17B:
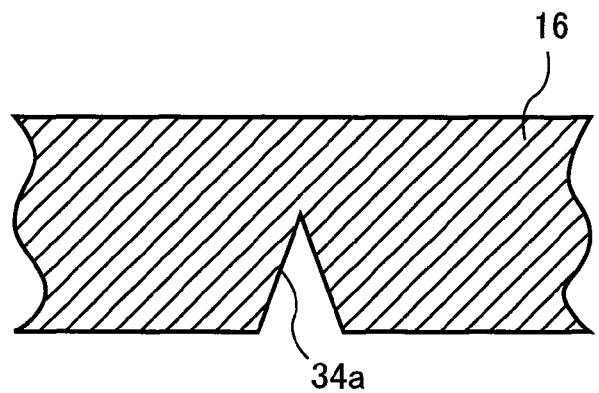

FIG. 17A and FIG. 17B illustrate a fourth modification example. In the fourth modification example which is applicable to the ceiling thermal insulator 16 of the heater 206 not including a rapid cooling device, four grooves 34a are provided as stress relief parts 34, and the grooves 34a extend from an intermediate part between the center and peripheral parts of the ceiling thermal insulator 16 toward the center part of the ceiling thermal insulator 16 with a width gradually increasing from the intermediate part to the center part of the ceiling thermal insulator 16. In addition, the width of the grooves 34a is smaller at the upper side (outer wall side) of the ceiling thermal insulator 16 than at the lower side (inner wall side) of the ceiling thermal insulator 16. In the current modification example, more preferably, the sectional shape of the grooves 34a is triangular, and the grooves 34a are disposed from the bottom surface of the ceiling thermal insulator 16. Therefore, the grooves 34a are wide at the in-furnace side of the ceiling thermal insulator 16, which is heated to a relatively high temperature, to efficiently absorb thermal expansion, and are narrow at the inner side of the ceiling thermal insulator 16 having a relatively low temperature to minimize heat dissipation. Instead of a triangular sectional shape, the grooves 34a can have a rounded or flat sectional shape which is narrowed from the bottom of the ceiling thermal insulator 16 to the bottom of the groove 34a.

Figure 18A:
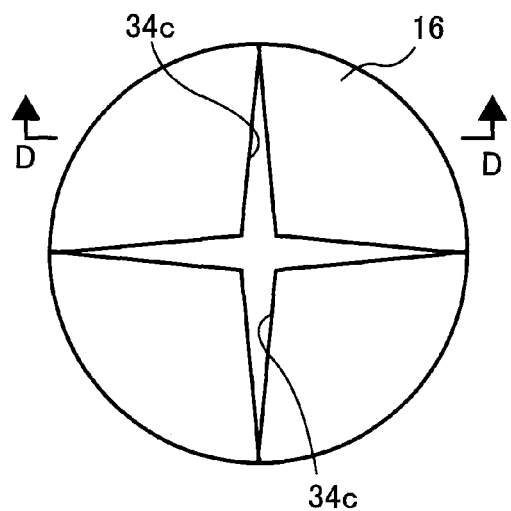
FIG. 18A through FIG. 18C illustrate a fifth modification example in accordance with an embodiment of the present invention.
Figure 18B:
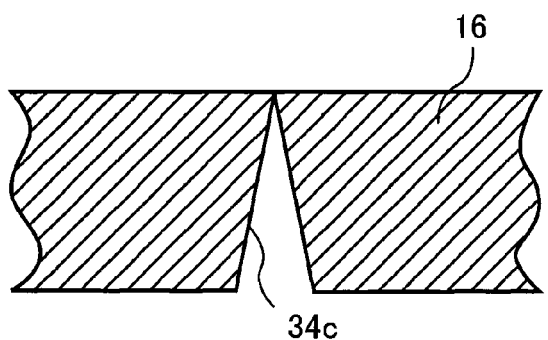
Figure 18C:
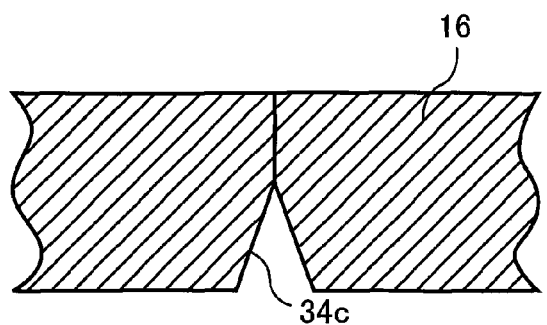

FIGS. 18A and 18B illustrate a fifth modification example. In the fifth modification example which is applicable to the ceiling thermal insulator 16 of the heater 206 not including a rapid cooling device, four dividing lines 34c provided as stress relief parts 34 are disposed from the peripheral part to the center part of the ceiling thermal insulator 16 with a gradually increasing width. In addition, the width of the dividing lines 34c is smaller at the upper side (outer wall side) of the ceiling thermal insulator 16 than at the lower side (inner wall side) of the ceiling thermal insulator 16. In the current modification example, more preferably, the dividing lines 34c have a triangular sectional shape that is wide at the bottom side of the ceiling thermal insulator 16. As shown in FIG. 18B, the sectional shape of the dividing lines 34c may be wholly triangular, or as shown in FIG. 18C, the dividing lines 34c may have a sectional shape including a triangle and a straight line extending from the tip of the triangle. Instead of a triangular sectional shape, the dividing lines 34c may have a rounded or flat sectional shape which is narrowed from the bottom of the ceiling thermal insulator 16 to the bottom of the dividing line 34c. In the fourth and fifth modification examples, the width of the stress relief parts 34 increases gradually from the peripheral part or the intermediate part toward the center part to efficiently reduce stresses; however, it is allowable that width of the stress relief parts 34 do not increase gradually from the peripheral part or the intermediate part toward the center part. The fourth and fifth modification examples can also be applied to the ceiling thermal insulator 16 of the heater including a rapid cooling device. In this case, an exhaust hole 24 is disposed at the center axis of the ceiling thermal insulator 16.

Figure 19:
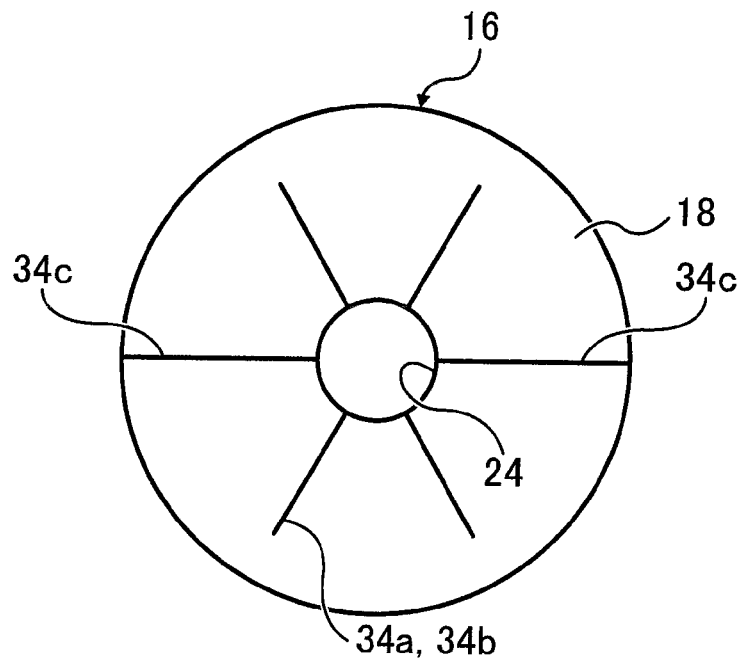
FIG. 19 is an underside view of a lower layer of a ceiling thermal insulator for illustrating a sixth modification example in accordance with an embodiment of the present invention.

FIG. 19 illustrates a sixth modification example. In the sixth modification example which is applicable to the ceiling thermal insulator 16 of the heater including a rapid cooling device, dividing lines 34c are used in combination with at least one of grooves 34a and slits 34b functioning as a stress relief part 34. Since the ceiling thermal insulator 16 has a divided structure, the ceiling thermal insulator 16 can be easily manufactured. Furthermore, stresses can be reduced owing to the stress relief part 34.

Figure 20:
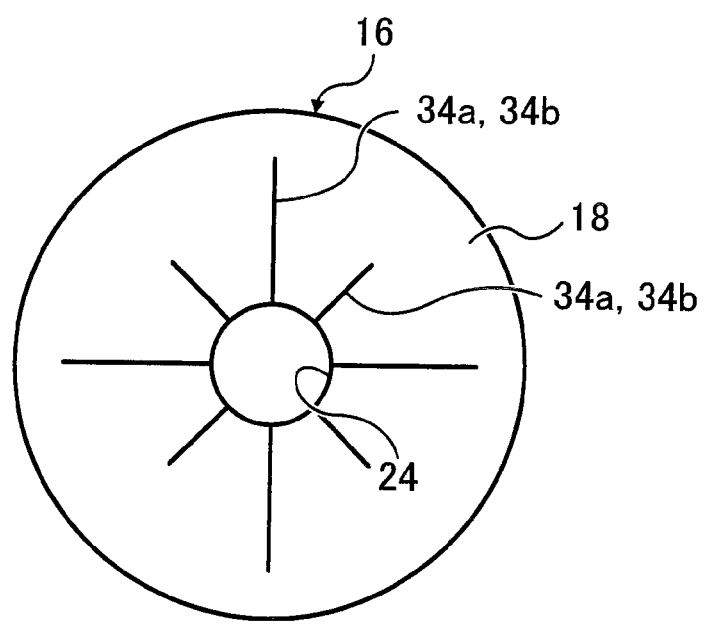
FIG. 20 is an underside view of a lower layer of a ceiling thermal insulator for illustrating a seventh modification example in accordance with an embodiment of the present invention.

FIG. 20 illustrates a seventh modification example. In the seventh modification example which is applicable to the ceiling thermal insulator 16 of the heater including a rapid cooling device, grooves 34a or slits 34b are disposed from the center part toward the peripheral part of the ceiling thermal insulator 16 as stress relief parts 34, and at least one of the grooves 34a and the slits 34b has a length different from the others. Since the temperature of the ceiling thermal insulator 16 increases toward the center of the ceiling thermal insulator 16 due to radiation, conduction, and convection of heat in the heating device, expansion of the ceiling thermal insulator 16 increases as it goes toward the center part of the ceiling thermal insulator 16. Furthermore, heat dissipation increases in proportion to the number of slits or grooves. Therefore, owing to above-described structure, stresses and heat dissipation can be controlled according to thermal expansion. In addition to the manner in which at least one of the grooves 34a and the slits 34b has a length different from the others, it is preferable that the surface area of the stress relief parts 34 be reduced from the center part toward the peripheral part of the ceiling thermal insulator 16.

Figure 21:
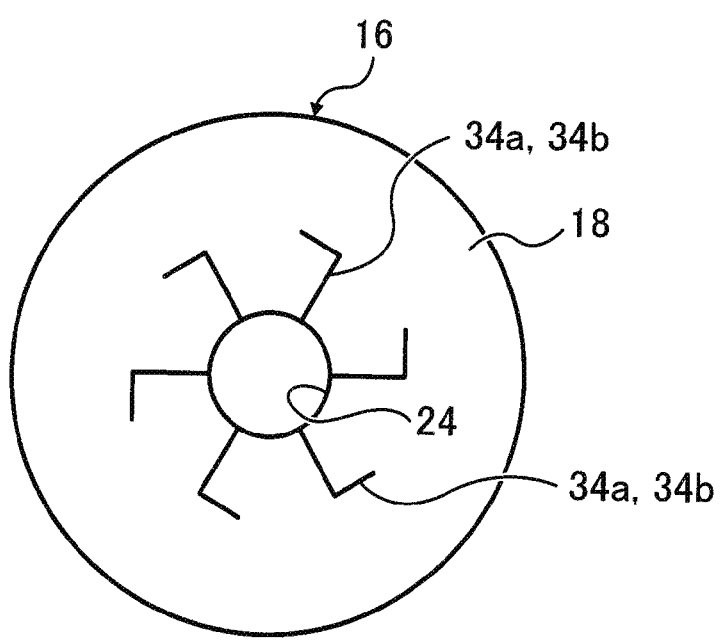
FIG. 21 is an underside view of a lower layer of a ceiling thermal insulator for illustrating an eighth modification example in accordance with an embodiment of the present invention.
Figure 22A:
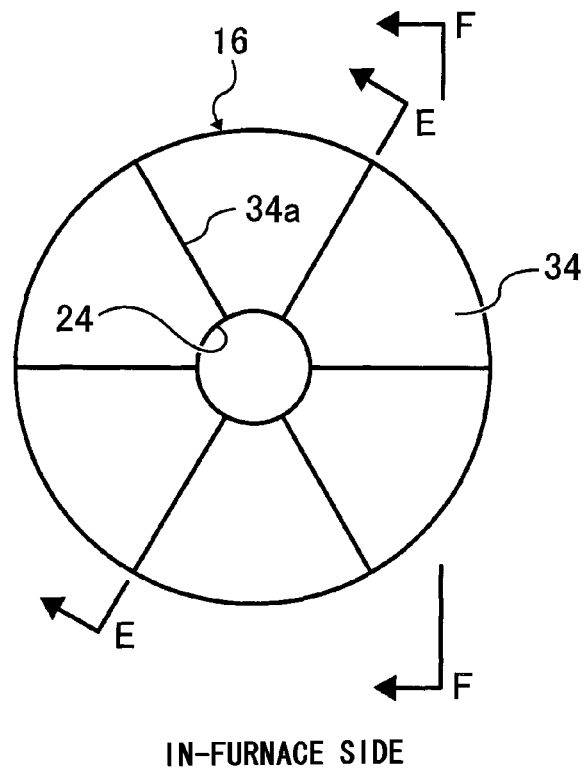
FIG. 22A through FIG. 22D illustrate a ninth modification example in accordance with an embodiment of the present invention.
Figure 22B:
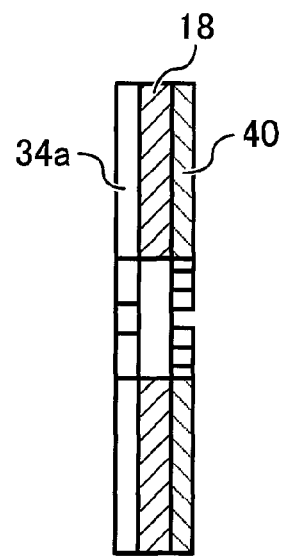
Figure 22C:
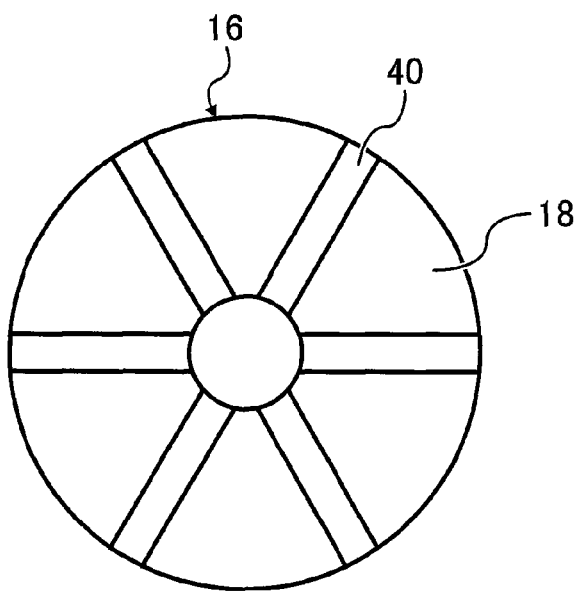
Figure 22D:
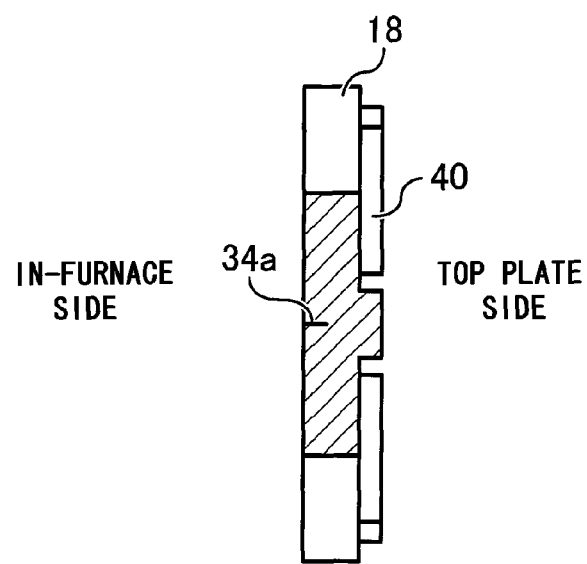

FIG. 21 illustrates an eighth modification example. In the eighth modification example which is applicable to the ceiling thermal insulator 16 of the heater including a rapid cooling device, grooves 34a or slits 34b are disposed from the center part toward the peripheral part of the ceiling thermal insulator 16 as stress relief parts 34, and ends of the grooves 34a or the slits 34b are bent in the circumferential direction. Owing to this structure, when stresses concentrate on the parts of the grooves 34a or slits 34b extending in a direction from the center part to the peripheral part of the ceiling thermal insulator 16, the stresses can be dispersed to the parts of the grooves 34a or slits 34b extending in the circumferential direction between the center and peripheral parts of the ceiling thermal insulator 16, such that generation of cracks can be prevented between the center and peripheral parts of the ceiling thermal insulator 16 in the circumferential direction.

FIG. 22A through FIG. 22D illustrate a ninth modification example. In the ninth modification example, protrusions (convexed parts) 40 are disposed at a side of the ceiling thermal insulator 16 opposite to grooves 34a serving as stress relief parts 34. Therefore, decreases of the strength and insulating ability of the ceiling thermal insulator 16 can be prevented.

The sixth to ninth modification examples can be applied to the ceiling thermal insulator 16 of the heater not having a rapid cooling device. In this case, the ceiling thermal insulator 16 does not have an exhaust hole 24 at its center axis.

In other modification examples, grooves 34a or slits 34b may be disposed along dividing lines 34c. Specifically, the grooves 34a or slits 34b are disposed in the mutually facing sides (contacting sides) of insulating parts. Therefore, heat dissipation through the upper side and lateral side (heating-device side) of the insulating parts can be prevented, and stresses caused by thermal expansion and contraction can be reduced, thereby preventing the insulating parts from being damaged or broken. The grooves 34a may be disposed in both or one of the mutually facing sides (contacting sides) of the insulating parts. The grooves 34a may be disposed in the ceiling thermal insulator 16 at a right angle or oblique angle with respect to the inner side of the ceiling thermal insulator 16. More preferably, the grooves 34a are disposed to be inclined in a direction different from a direction of a heating line of an adjacent heating element 14. In this case, heat dissipation can be further prevented. The shape of the sidewall thermal insulator of the heating device is not limited to a circular shape. For example, the sidewall thermal insulator 12 may have an angled shape.

According to the present invention, cracking of the ceiling insulating part can be reduced, and breakage and falling of the ceiling insulating part can be reduced.

The present invention is characterized by the appended claims; however, the present invention also includes the following embodiments.

(Supplementary Note 1) According to a preferred embodiment of the present invention, there is provided a substrate processing apparatus comprising: a reaction vessel configured to process a substrate; and a heating device, wherein the heating device comprises: at least one sidewall insulating part surrounding the reaction vessel; a ceiling insulating part placed on the sidewall insulating part and comprising a plurality of stress relief grooves on a lower surface thereof; and a heating element installed at an inner side of the sidewall insulating part.

(Supplementary Note 2) In the substrate processing apparatus of Supplementary Note 1, each of the plurality of grooves extends from a center part of the ceiling insulating part to a peripheral part of the ceiling insulating part.

(Supplementary Note 3) In the substrate processing apparatus of Supplementary Note 2, each of the plurality of grooves is wider at the center part of the ceiling insulating part than at the peripheral part of the ceiling insulating part.

Since the temperature of the ceiling insulating part is higher at the center part than at the peripheral part of the ceiling insulating part due to radiation, conduction, and convection of heat in the heating device, the expansion rate of the ceiling insulating part is higher at the center part than the peripheral part of the ceiling insulating part. Furthermore, if the grooves have a large size, heat dissipation through the grooves is accordingly high. Therefore, by using the above-described structure, stresses and heat dissipation can be controlled according to thermal expansion.

(Supplementary Note 4) In the substrate processing apparatus of Supplementary Note 2, each of the plurality of grooves widens from the peripheral part to the center part of the ceiling insulating part.

Since the temperature of the ceiling insulating part increases toward the center part of the ceiling insulating part due to radiation, conduction, and convection of heat in the heating device, the expansion rate of the ceiling insulating part also increases toward the center part than the peripheral part. Furthermore, if the grooves have a large size, heat dissipation through the grooves is accordingly high. Therefore, by using the above-described structure, stresses and heat dissipation can be controlled according to thermal expansion.

(Supplementary Note 5) In the substrate processing apparatus of Supplementary Note 1 or 2, each of the plurality of grooves is narrower at an outer wall side of the ceiling insulating part than at an inner wall side of the ceiling insulating part.

Since the temperature of the ceiling insulating part is relatively high at the inner wall side due to radiation, conduction, and convection of heat in the heating device, the expansion rate of the ceiling insulating part is relatively high at the inner wall side of the ceiling insulating part. Therefore, by using the above-described structure, stresses and heat dissipation can be controlled according to thermal expansion.

(Supplementary Note 6) In the substrate processing apparatus of Supplementary Note 1 or 2, each of the plurality of grooves narrows from an inner wall side to an outer wall side of the ceiling insulating part.

Since the temperature of the ceiling insulating part increases toward the inner wall side due to radiation, conduction, and convection of heat in the heating device, the expansion rate of the ceiling insulating part also increases toward the inner wall side of the ceiling insulating part. Therefore, by using the above-described structure, stresses and heat dissipation can be controlled according to thermal expansion.

(Supplementary Note 7) In the substrate processing apparatus of Supplementary Note 1, sidewalls of each of the plurality of grooves are chamfered at an inner side of the ceiling insulating part.

(Supplementary Note 8) In the substrate processing apparatus of Supplementary Note 1 or 2, the ceiling insulating part is divided into a plurality of parts, and the plurality of grooves are disposed in the plurality of parts.

(Supplementary Note 9) In the substrate processing apparatus of Supplementary Note 2, the plurality of grooves have an angle equal to or smaller than 180 degrees therebetween.

Since the ceiling insulating part expands from its center side to its peripheral side, it is difficult to relieve a stress at a part of the ceiling insulating part if at least one groove is not disposed at a sector of the ceiling insulating part having an angle equal to or smaller than 180 degrees; however, if at least one groove is disposed at a sector of the ceiling insulating part having an angle equal to or smaller than 180 degrees, expansion of each section of the ceiling insulating part can be absorbed.

(Supplementary Note 10) In the substrate processing apparatus of Supplementary Note 2, the plurality of grooves are at least three in number, extend radially and have an angle greater than 90 degrees but smaller than 180 degrees therebetween.

(Supplementary Note 11) In the substrate processing apparatus of Supplementary Note 1, the ceiling insulating part may comprise an exhaust hole at a center part for exhausting an inside atmosphere of the heating device.

In this case, when a heated atmosphere is discharged through the exhaust hole to cool the process chamber, the temperature of the ceiling insulating part (Supplementary Note particularly, the center part of the ceiling insulating part) may increase, and thus the center part of the ceiling insulating part may expand. However, by constructing the ceiling insulating part like Supplementary Note 1, cracking of the ceiling insulating part or falling of broken parts of the ceiling insulating part can be prevented.

(Supplementary Note 12) In the substrate processing apparatus of Supplementary Note 1 or 2, the ceiling insulating part may be divided into a plurality of parts, and the plurality of grooves are disposed separate from the divided parts.

(Supplementary Note 13) In the substrate processing apparatus of Supplementary Note 1 or 2, the ceiling insulating part may comprise a slit, and the plurality of grooves may be disposed separate from the slit.

(Supplementary Note 14) In the substrate processing apparatus of Supplementary Note 2, the plurality of grooves has at least two lengths.

(Supplementary Note 15) In the substrate processing apparatus of Supplementary Note 1, the ceiling insulating part comprises a convexed part on an upper surface thereof. (a side opposite to the grooves).

(Supplementary Note 16) There is provided a heating device used in a substrate processing apparatus. The heating device comprises a sidewall insulating part and a ceiling insulating part, and the ceiling insulating part comprises a plurality of stress relief grooves at an inner side placed on the sidewall insulating part.

(Supplementary Note 17) There is provided a substrate processing apparatus comprising: a reaction vessel configured to process a substrate; and a heating device, wherein the heating device comprises: at least one sidewall insulating part surrounding the reaction vessel; a ceiling insulating part placed on the sidewall insulating part and comprising a plurality of stress relief grooves which are wider at a center part of the ceiling insulating part than at a peripheral part of the ceiling insulating part; and a heating element installed at an inner side of the sidewall insulating part.

(Supplementary Note 18) There is provided a substrate processing apparatus comprising: a reaction vessel configured to process a substrate; and a heating device, wherein the heating device comprises: at least one sidewall insulating part surrounding the reaction vessel; a ceiling insulating part placed on the sidewall insulating part and comprising a plurality of stress relief grooves which are narrower at an outer wall side of the ceiling insulating part than at an inner wall side of the ceiling insulating part; and a heating element installed at an inner side of the sidewall insulating part.

(Supplementary Note 19) In the substrate processing apparatus of Supplementary Note 7, the sidewalls of the grooves may be chamfered in a tapered or curved shape.

(Supplementary Note 20) There is provided a method of manufacturing a semiconductor device, the method comprising processing a substrate disposed inside a reaction vessel by heating the substrate using a heating element installed at an inner side of a sidewall insulating part of a heating device installed around the reaction vessel while allowing stresses to be relieved by a plurality of grooves disposed in an inner side of a ceiling insulating part placed on the sidewall insulating part.

What is claimed is:

1. A substrate processing apparatus comprising:
    a reaction vessel configured to process a substrate; and
    a heating device,
    wherein the heating device comprises:
    at least one sidewall insulating part surrounding the reaction vessel;
    a ceiling insulating part placed on the sidewall insulating part; and
    a heating element installed at an inner side of the sidewall insulating part, and
    wherein the ceiling insulating part is divided into a plurality of parts by a dividing line and comprises a plurality of stress relief grooves extending from a center of the ceiling insulating part to a circumference thereof, each of the plurality of stress relief grooves having a depth with respect to a bottom surface of the ceiling insulating part without penetrating the ceiling insulating part and without dividing the ceiling insulating part into the plurality of parts.

2. The substrate processing apparatus of claim 1, wherein the plurality of the stress relief grooves have an angle equal to or smaller than 180 degrees therebetween.

3. The substrate processing apparatus of claim 1, wherein the ceiling insulating part comprises an exhaust hole at a center part for exhausting an inside atmosphere of the heating device.

4. The substrate processing apparatus of claim 1,
    wherein the ceiling insulating part at least comprises a lower layer and an upper layer, and
    wherein each of the plurality of stress relief grooves comprises a slit disposed in the lower layer.

* * * * *